United States Patent
Tzeng et al.

(10) Patent No.: US 9,157,957 B1
(45) Date of Patent: Oct. 13, 2015

(54) PLL STATUS DETECTION CIRCUIT AND METHOD THEREOF

(71) Applicant: REALTEK SEMICONDUCTOR CORPORATION, Hsinchu (TW)

(72) Inventors: Chao-Wen Tzeng, Taichung (TW); Ying-Yen Chen, Chiayi County (TW); Jih-Nung Lee, Hsinchu County (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 14/644,758

(22) Filed: Mar. 11, 2015

(30) Foreign Application Priority Data

Jun. 13, 2014 (TW) .............................. 103120399 A

(51) Int. Cl.
*G01R 31/317* (2006.01)
*H03L 7/08* (2006.01)
*G01R 31/28* (2006.01)

(52) U.S. Cl.
CPC ...... *G01R 31/31727* (2013.01); *G01R 31/2882* (2013.01); *H03L 7/08* (2013.01)

(58) Field of Classification Search
USPC ........... 327/147–149, 156–158; 714/726, 731
See application file for complete search history.

(56) References Cited

U.S. PATENT DOCUMENTS

| | | | |
|---|---|---|---|
| 7,168,020 B2 | 1/2007 | Chen et al. | |
| 8,040,995 B2 | 10/2011 | Fukushima | |
| 2006/0117230 A1* | 6/2006 | Scipioni et al. | 714/701 |
| 2007/0245180 A1* | 10/2007 | Li | 714/718 |
| 2012/0150473 A1* | 6/2012 | Grise et al. | 702/117 |
| 2012/0173943 A1* | 7/2012 | Cesari | 714/731 |
| 2013/0326299 A1* | 12/2013 | Oshima | 714/735 |
| 2014/0154997 A1* | 6/2014 | Chen et al. | 455/67.14 |
| 2014/0164860 A1* | 6/2014 | Kim | 714/731 |
| 2014/0292385 A1* | 10/2014 | Bahl et al. | 327/144 |
| 2015/0067428 A1* | 3/2015 | Singer et al. | 714/729 |
| 2015/0131392 A1* | 5/2015 | Aizawa | 365/194 |
| 2015/0198663 A1* | 7/2015 | Syed | 714/726 |
| 2015/0204945 A1* | 7/2015 | Sanghani et al. | 714/727 |

* cited by examiner

*Primary Examiner* — Adam Houston
(74) *Attorney, Agent, or Firm* — WPAT, P.C.; Anthony King

(57) ABSTRACT

A PLL status detection circuit and its associated method are disclosed herein. The circuit and the method are used to detect a PLL clock generated by a PLL of a chip to determine a status of the PLL. The PLL status detection circuit includes a counter, a status analyzing circuit and a status storing circuit. The counter is configured to generate a count value by counting cycles of the PLL clock according to a control signal. The status analyzing circuit, which is coupled to the counter, is configured to analyze the count value according to the control signal to generate an analyzed result. The status storing circuit, which is coupled to the status analyzing circuit, is configured to store the analyzed result. The status storing circuit is coupled to a scan chain of the chip so that the analyzed result is transmitted via the scan chain.

21 Claims, 6 Drawing Sheets

US 9,157,957 B1

PLL STATUS DETECTION CIRCUIT AND METHOD THEREOF

BACKGROUND

1. Field of the Disclosure

The present disclosure relates to a circuit and an associated method for testing a chip, especially to a circuit and an associated method for testing a PLL (Phase Lock Loop) inside a chip.

2. Description of Related Art

A chip must pass a series of tests to verify its quality before sale. When a clock speed inside the chip plays an important part in the functionality of the chip, an at-speed test becomes one of the essential tests. Because a test machine nowadays can only provide limited test clock speeds, the use of the PLL inside the chip to generate a high-speed clock for the at-speed test is widely accepted. As a result, the accuracy in the at-speed test is highly dependent on the quality and condition of the clock generated by the PLL. In other words, a chip's failure in the at-speed test may result either from a defect of the chip itself or from imperfection of the test clock. For example, the clock generated by the PLL has a large jitter, or the frequency of the clock is not as expected because settings for the PLL are incorrect, or because a control signal that controls the PLL is subject to the test contents of the at-speed test. In addition, since the PLL is critical in providing an accurate working clock for the entire chip to work properly, a malfunction in the PLL can lead to unexpected errors.

Some prior-art methods are proposed to verify the clock generated by the PLL. Referring to FIG. 7, a test circuit disclosed in the U.S. Pat. No. 7,168,020 is presented. The test circuit includes a flip-flop 201, a flip-flop 202 and an XOR gate 203. The flip-flop 201 receives a PLL clock PLL_CLK and a sampling clock EXT_CLK. The frequency of the sampling clock EXT_CLK is twice the frequency of the PLL clock PLL_CLK. Therefore, the flip-flop 201 is trigged twice within one time period of the PLL clock PLL_CLK. As a result, the output signal SAMP of the flip-flop 201 has the same frequency as the PLL clock PLL_CLK. The flip-flop 202 receives the output signal SAMP of the flip-flop 201 and the sampling clock EXT_CLK, and generates an output signal SAMP_D1. The output signal SAMP_D1 has the same frequency as the output signal SAMP but is delayed by one time period of the sampling clock EXT_CLK, namely, half the time period of the PLL clock PLL_CLK. Therefore, there is a 180-degree phase difference between the output signal SAMP_D1 and the output signal SAMP. In other words, an output FAIL of the XOR gate 203 is at a high level when the PLL is in normal operation (i.e., the PLL clock PLL_CLK oscillating with a constant time period). The output signal SAMP and the output signal SAMP_D1 may be at a high level or a low level at the same time when the PLL is not in normal operation (i.e., the PLL clock PLL_CLK not oscillating or oscillating with an inconstant time period). A low-level output FAIL of the XOR gate 203 indicates that the PLL is not in normal operation. Although an abnormal operation of the PLL can be detected by the test circuit, the quality of the PLL clock and whether the abnormal operation is caused by false settings of the PLL cannot be known. In addition, the sampling clock EXT_CLK must be precisely controlled to slightly lead the PLL clock PLL_CLK to accurately sample the PLL clock PLL_CLK; such limitation increases the difficulty in practicing the test. Further, U.S. Pat. No. 8,040,995 discloses another test method, which uses a circuit for measuring jitters of a PLL clock. The circuit uses an oscillator to generate an oscillating signal whose frequency is a multiple of that of the PLL clock, and uses a counter to count the number of cycles of the oscillating signal in a count interval, in which the count interval is an integer multiple of the time period of the PLL clock. Then, the count result is analyzed to obtain the jitter information of the PLL clock. A shortcoming of this circuit is that the oscillator is so easily affected by manufacturing, voltage and temperature that the oscillating signal becomes unstable. Whenever there is a change in manufacturing, voltage and/or temperature, the measure result becomes inaccurate. In short, this circuit is not capable of determining how the temperature affects the PLL because the temperature has a greater influence on the reference clock (i.e., the oscillating signal) than on the PLL clock.

SUMMARY

In consideration of the imperfections of the prior art, an object of the present disclosure is to provide a PLL status detection circuit and method thereof, so as to make an improvement to the prior art.

This disclose introduces a PLL status detection circuit for detecting a clock generated by a PLL of a chip to determine a status of the PLL. The PLL status detection circuit includes: a counter, configured to generate a count value by counting the number of cycles of the clock according to a control signal; a status analyzing circuit, coupled to the counter, configured to analyze the count value according to the control signal to generate an analyzed result; and a status storing circuit, coupled to the status analyzing circuit, configured to store the analyzed result. The status storing circuit is coupled to a scan chain of the chip and the analyzed result is transmitted via the scan chain.

This disclose also introduces a method of detecting a PLL status for detecting a clock generated by a PLL of a chip to determine a status of the PLL, The method includes steps of: generating a count value by counting a number of cycles of the clock according to a control signal; analyzing the count value according to the control signal to generate an analyzed result; and storing the analyzed result in a status storing circuit. The status storing circuit is coupled to a scan chain of the chip, and the analyzed result is transmitted via the scan chain.

The PLL status detection circuit and the method of detecting a PLL status determine whether the PLL clock is in good condition as an at-speed test is conducted to a PLL-embedded chip, which includes a PLL, to assure that if the PLL accounts for the test failure of the chip. The detection circuit and method of this disclosure not only determine whether the PLL is in good condition or not but obtain an average jitter of the PLL clock. In addition, the detection circuit and method of this disclosure are not influenced by manufacturing process, voltage and temperature so as to provide a relatively stable detection result. In addition to the at-speed test, this disclosure can also be applied to a function test of a chip.

These and other objectives of the present disclosure doubt becomes obvious to those of ordinary skill in the art after reading the following detailed description of the embodiments that are illustrated in the various figures and drawings.

DETAILED DESCRIPTION OF THE EMBODIMENTS

The following description is written by referring to terms of this technical field. If any term is defined in the specification, such term should be explained accordingly. In addition, the connection between objects or events in the following embodiments can be direct or indirect provided that these embodiments are still applicable under such connection. Said "indirect" means that an intermediate object or a physical space exists between the objects, or an intermediate event or a time interval exists between the events. A PLL status detection circuit and method thereof are disclosed, and the detail known in this field is omitted if such detail has little to do with the features of the present disclosure. People of ordinary skill in the art can choose components or steps equivalent to those described in this specification to carry out the present disclosure, which means that the scope of this disclosure is not limited to the embodiments in the specification. On account of that some or all elements of said device disclosure could be known, the detail of such elements is omitted provided that this omission nowhere dissatisfies the specification and enablement requirements. In addition, said method can be in the form of firmware and/or software which could be carried out by the device of this disclosure or the equivalent thereof. Hence, the following description on the method disclosure focuses on the processes and steps instead of the hardware without dissatisfying the specification and enablement requirements.

Figure 1:
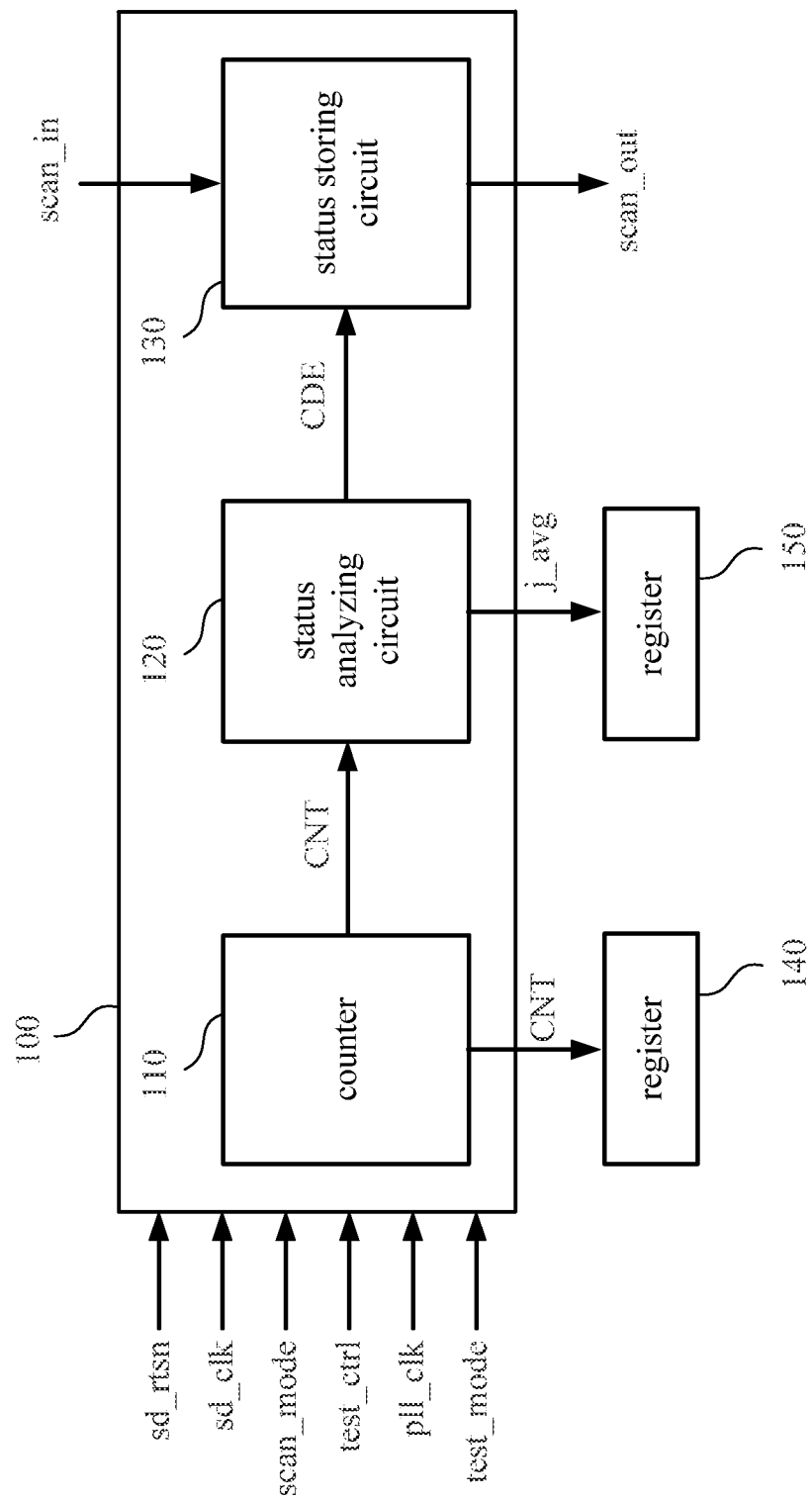
FIG. 1 illustrates a functional block diagram of a PLL status detection circuit according to an exemplary embodiment.

FIG. 1 shows a functional block diagram of a PLL status detection circuit according to an exemplary embodiment. The PLL status detection circuit 100 resides in a chip (not shown in FIG. 1) and comprises a counter 110, a status analyzing circuit 120 and a status storing circuit 130. The PLL status detection circuit 100 can be used for an at-speed test and a function test of the chip to determine whether a PLL in the chip is in good condition or not as the tests are being carried out. A mode control signal scan_mode controls the PLL status detection circuit 100 to switch between the at-speed test and the function test. When the circuit launches, or when a test begins, a reset signal sd_rtsn is used to restart the PLL status detection circuit 100 so as to restore the PLL status detection circuit 100 to its initial status, such that the test can be conducted accurately. A test clock sd_clk is provided by the test machine. Test data are fed into a scan chain of the chip according to the test clock sd_clk. A test control signal test_ctrl is also provided by the test machine. The PLL status detection circuit 100 operates according to the level of the test control signal test_ctrl. When the test control signal test_ctrl is at one level (e.g., a logic high level), the counter 110 counts the cycles of the PLL clock pll_clk and generates a count value CNT; when the test control signal test_ctrl is at another level (e.g., a logic low level), the counter is stopped and the status analyzing circuit 120 starts generating a count difference j_avg according to a current count value and a previous count value generated by the counter 110. The count difference j_avg is related to the jitter of the PLL clock pll_clk. The status analyzing circuit 120 then generates a status code CDE, which is stored in the status storing circuit 130, according to the count difference j_avg and a standard value. The status code CDE indicates whether the PLL clock pll_clk is abnormal, e.g., too large jitter, huge time period variation, or even no signal. The status storing circuit 130 is connected in series with the scan chain (not shown) in the chip and is a part of the scan chain. The status storing circuit 130 can be implemented by flip-flops, which are connected to other flip-flops of the scan chain. A scan chain input signal scan_in is an output signal of a flip-flop prior to the status storing circuit 130, and a scan chain output signal scan_out is an input signal of a flip-flop subsequent to the status storing circuit 130. As a result, the status code CDE obtained by the PLL status detection circuit 100 is outputted together with the data in the scan chain. A test mode signal test_mode is to control the PLL status detection circuit 100 to perform a self test or to monitor the status of the PLL. For example, when the test mode signal test_mode is at high level, the PLL status detection circuit 100 uses the test clock sd_clk to perform a self-test, and when the test mode signal test_mode is at low level, the PLL status detection circuit 100 determines whether the PLL clock pll_clk is in good condition according to the test control signal test_ctrl.

Figure 2:
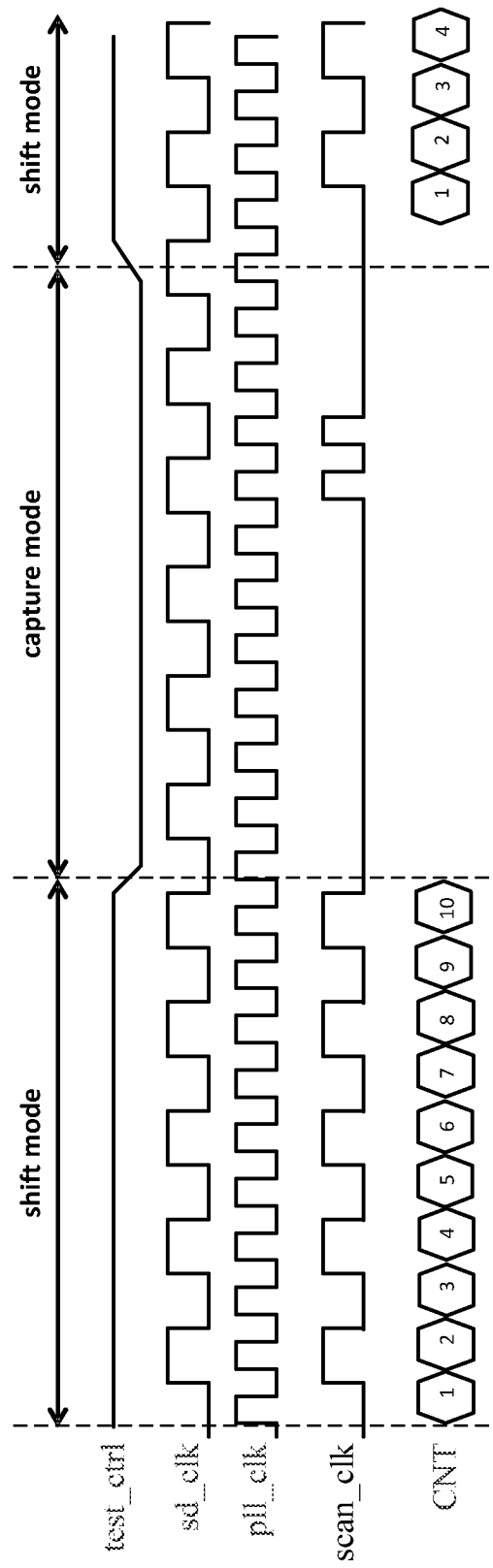
FIG. 2 illustrates a timing diagram of the PLL status detection circuit.

FIG. 2 shows a timing diagram of the PLL status detection circuit. The PLL status detection circuit 100 is in a shift mode when the test control signal test_ctrl is at high level, and in a capture mode when the test control signal test_ctrl is at low level. A scan clock scan_clk is a clock received by the scan chain. In the shift mode, the scan clock scan_clk is equal to the test clock sd_clk, and test data are transmitted in order into the flip-flops of the scan chain according to the scan clock scan_clk (i.e., the test clock sd_clk). The operation time for the shift mode must be sufficient for the test data to be transmitted to the entire scan chain. For example, if a time period of the test clock sd_clk is 50 ns and the length of the scan chain is 200 (i.e., including 200 flip-flops), the time for the shift mode must be at least 50 ns×200=10000 ns. The end of the shift mode indicates that the test data are transmitted to the entire scan chain. In the following capture mode, data are retrieved from the scan chain and then analyzed to determine whether the PLL in the chip is in good condition. When the PLL status detection circuit 100 switches from the shift mode to the capture mode, the scan clock scan_clk switches from the test clock sd_clk to the PLL clock pll_clk. A preparation time between the mode switch is required in order to prevent timing failure. In the preparation time, the scan clock scan_clk keeps at low level. After the preparation time finishes, the scan clock scan_clk is equal to the PLL clock pll_clk. In short, the operation time of the counter 110 and the status analyzing circuit 120 is controlled according to different modes of the test control signal test_ctrl so that the PLL is detected.

In the shift mode, the counter 110 generates count values by counting the number of cycles of the PLL clock pll_clk. In FIG. 2, for example, 10 cycles are included in the shift mode, so the counter 110 outputs the count value CNT of 10 to the status analyzing circuit 120 after the shift mode finishes. The status analyzing circuit 120 calculates an absolute difference between a current count value count_cur and a previous count value count_pre. The absolute difference is the count difference j_avg (=|count_crr−count_pre|). The count difference j_avg is able to represent the stability of the PLL clock pll_clk. A small count difference j_avg indicates that the PLL clock pll_clk has the same number of cycles in the same interval (i.e., the time for the shift mode), which stands for a relatively stable PLL clock pll_clk. On the other hand, a large count difference j_avg probably arises from (a) the PLL clock pll_clk having a large jitter, which leads to different count values CNT for the same count time; (b) the wrongly set PLL in the chip, which causes the time period of the PLL clock pll_clk to be not as expected; or (c) a wrong control signal of the PLL as being influenced by the test data; for example, if a flip-flop that controls the PLL is mistakenly connected to the scan chain, the setting value of the PLL changes continuously as the test data keep shifting in the scan chain, which results in disorder in the time period of the PLL clock pll_clk or even results in no signal.

In addition to calculating the count difference j_avg, the status analyzing circuit 120 also generates a status code CDE according to the count difference j_avg and a predetermined value. To be more specific, the count difference j_avg is divided by the current count value count_cur to obtain a variation value PLL_jitter that indicates a variation degree of the PLL clock pll_clk, and then the variation value PLL_jitter is compared with the predetermined value (e.g., 10%) to obtain the status code CDE. The table below shows a relationship between the status code CDE and the variation value PLL_jitter according to an exemplary embodiment.

| status code CDE | status |
|---|---|
| 00 | PLL_jitter <10% |
| 10 | PLL_jitter >10% |
| 11 | no signal |

A status code CDE of 00 indicates that the PLL clock pll_clk is in good condition; a status code CDE of 10 indicates that the PLL clock pll_clk has large jitter or time period disorder; and a status code CDE of 11 indicates other errors, such as a count value CNT of value 0, which means the PLL has no output or does not work temporarily.

In summary, the variation value PLL_jitter can be used to indicate an average jitter of the PLL clock pll_clk. Following the above example, the time for the shift mode is 10000 ns, and if the time period of the PLL clock pll_clk is 8 ns, the count value CNT is 10000/8=1250. Assuming that a previous count value CNT is 1240, then an average jitter is (1250−1240)/1250×100%=0.8% or (1250−1240)×8 ns/1250=0.064 ns. A resolution of the PLL status detection circuit 100 is the time period of the PLL clock pll_clk divided by a product of the time period of the test clock sd_clk and the length of the scan chain, namely, a reciprocal of the count value CNT. A resolution of 1/1250×100%=0.08% in this example means that the minimum jitter that can be detected by the PLL status detection circuit 100 is 0.08%. That is, the higher the count value CNT can be obtained in the shift mode, the higher the accuracy of the PLL status detection circuit 100 is.

Figure 3:
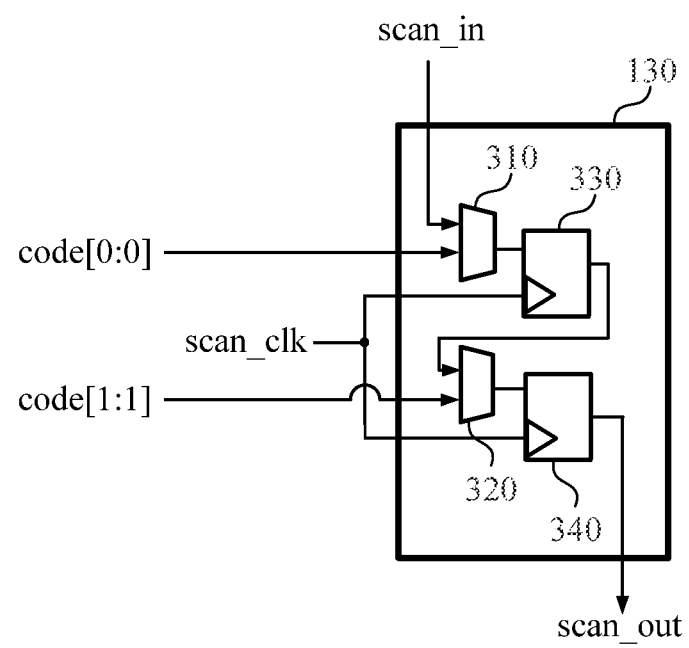
FIG. 3 illustrates a circuitry of the status storing circuit 130 according to an exemplary embodiment.

The status code CDE is then outputted by the status analyzing circuit 120 to the status storing circuit 130 for storage. FIG. 3 shows a circuitry of the status storing circuit 130 according to an exemplary embodiment. The status storing circuit 130 comprises a multiplexer 310, a multiplexer 320, a flip-flop 330 and a flip-flop 340. The multiplexer 310 receives the scan chain input signal scan_in, which is the output signal of a prior flip-flop connected to the status storing circuit 130, and code[0:0], which is the first bit (the lowest bit) of the status code CDE. The output of the multiplexer 310 is coupled to the flip-flop 330. The multiplexer 320 receives the output signal of the flip-flop 330 and code[1:1], which is the second bit of the status code CDE. The output of the multiplexer 320 is coupled to the flip-flop 340. The flip-flop 340 outputs the scan chain output signal scan_out, which is the input signal of a subsequent flip-flop of the scan chain connected to the status storing circuit 130. The clock input terminals of the flip-flop 330 and the flip-flop 340 receive the scan clock scan_clk. During the test process, the multiplexer 310 and the multiplexer 320 respectively select code[0:0] and code[1:1] to input to the flip-flop 330 and the flip-flop 340. The flip-flop 330 and the flip-flop 340 respectively store the 1-bit signal. After the test process finishes and the test result is ready to be output, the multiplexer 310 selects the scan chain input signal scan_in to be input to the flip-flop 330, and the multiplexer 320 selects the output of the flip-flop 330 to be input to the flip-flop 340. As a result, the flip-flop 330 and the flip-flop 340 are connected in series with the flip-flops of the scan chain, and thus the status code CDE is output to the test machine together with the data in the scan chain. Because this embodiment has only 3 PLL statuses, a 2-bit status code CDE is sufficient; that is, the status storing circuit 130 requires only 2 flip-flops for storing 1-bit of the 2-bit data in each. In other embodiments, however, if k types of PLL statuses are demonstrated (k being an integer larger than 1), then the status code CDE must comprise n bits (n being an integer satisfying $2n \geq k$), which implies that the status storing circuit 130 includes n flip-flops to store the n-bit data.

Figure 4:
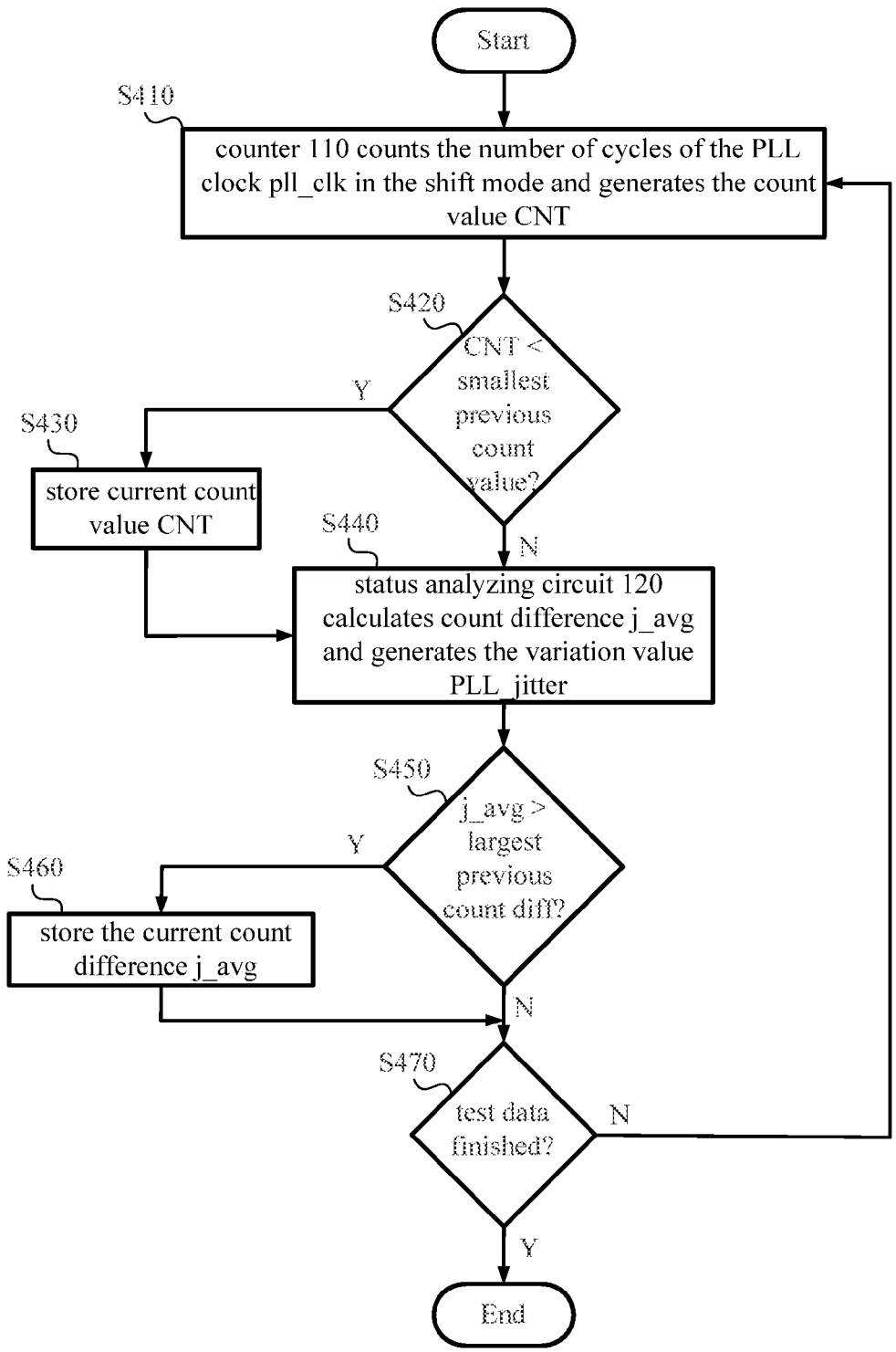
FIG. 4 illustrates a flow chart of the operation of the PLL status detection circuit 100.

FIG. 4 shows a flow chart of the operation of the PLL status detection circuit 100. When the test starts, the counter 110 counts the number of cycles of the PLL clock pll_clk in the shift mode and generates the count value CNT accordingly (step S410). If the count value CNT is generated for the first time, the count value CNT is stored directly. Otherwise, the current count value is compared with a previous count value (step S420). If the current count value is smaller than the smallest previous count value, then the current count value is stored (step S430). An external register 140 can be used to store a minimum value of the count value based on a user's demand. The status analyzing circuit 120 then calculates the difference of the count values CNT in the capture mode to generate the count difference j_avg, and generates the variation value PLL_jitter according to the count difference j_avg and the a predetermined value (step S440). If the count difference j_avg is generated for the first time, the status analyzing circuit 120 stores the count difference j_avg directly. Otherwise, the status analyzing circuit 120 compares the current count difference j_avg with a previous count difference j_avg (step S450). If the current count difference j_avg is larger than the previous count difference j_avg, the status analyzing circuit 120 stores the current count difference j_avg (step S460). An external register 150 can be used to store the maximum count difference j_avg based on a user's demand. The maximum count difference j_avg and the minimum value of the count value help determine the quality of the PLL clock pll_clk. If the test data are not finished (step S470), the process goes back to step S410; otherwise, the test process finishes.

Figure 5:
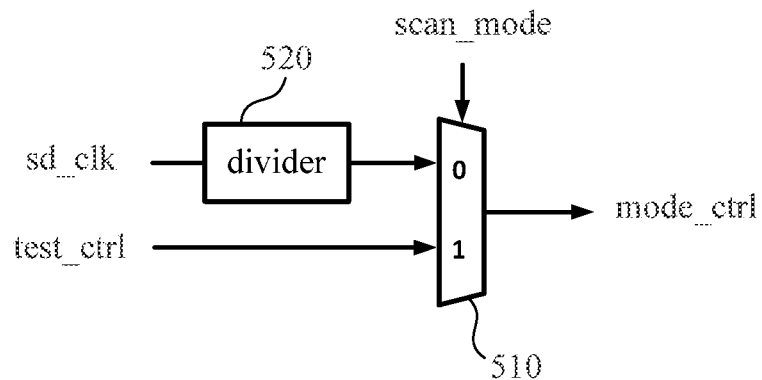
FIG. 5 illustrates a circuitry that selects a control signal according to an exemplary embodiment.

As mentioned above, in addition to the at-speed test, the PLL status detection circuit 100 can also be applied to a function test of a chip. In the function test, however, the test machine does not provide the test control signal test_ctrl. Even if the test machine provides the test control signal test_ctrl, most function tests neglect the test control signal test_ctrl. Therefore, when the PLL status detection circuit 100 is used for function tests, another control signal, according to which the PLL status detection circuit 100 switches between the shift mode and the capture mode, must be provided. FIG. 5 shows a circuitry that selects a control signal according to an exemplary embodiment. The multiplexer 510 selects the test control signal test_ctrl or the test clock sd_clk to be the control signal mode_ctrl that determines the mode (i.e., the shift mode or the capture mode) based on whether the at-speed test or the function test is currently conducted (i.e., according to the mode control signal scan_mode). The control signal mode_ctrl is then input to the PLL status detection circuit 100. Mostly the test clock sd_clk is a relatively fast clock so a frequency divider 520 is used to divide the frequency (e.g., divided by 214) to obtain a slower clock, and the PLL status detection circuit 100 operates according to the divided clock.

Figure 6:
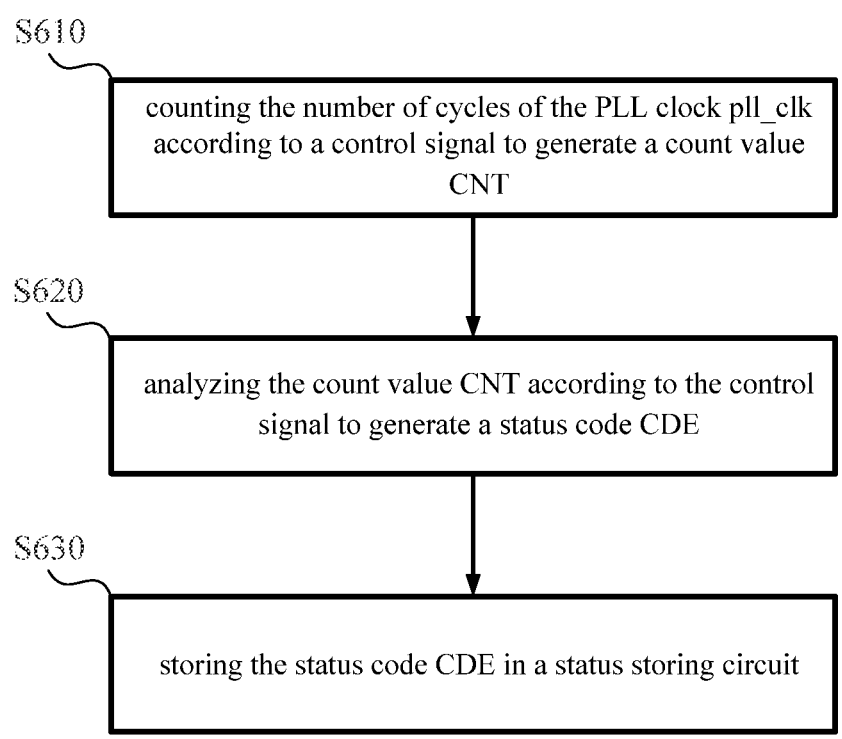
FIG. 6 illustrates a flow chart of the method of detecting a PLL status.
Figure 7:
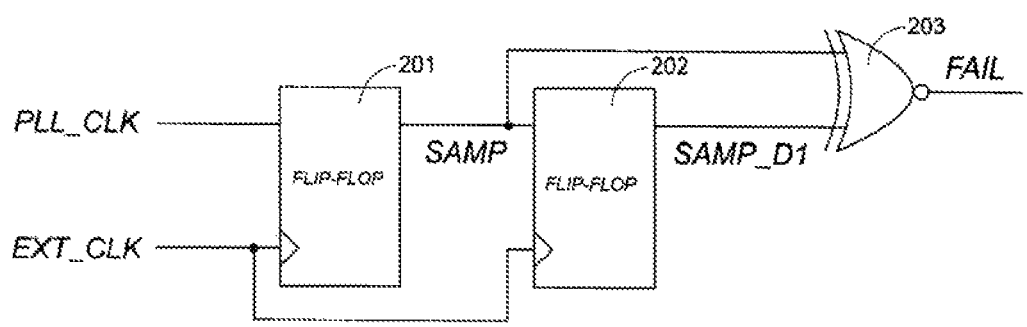
FIG. 7 illustrates a prior-art test circuit.

FIG. 6 shows a flow chart of the method of detecting a PLL status. In addition to the PLL status detection circuit, a method of detecting a PLL status is also disclosed. The method can be applied to a chip in an at-speed test and a function test to determine whether the PLL of the chip is in good condition. This method can be carried out by the PLL status detection circuit 100 or its equivalent circuit. As shown in FIG. 6, the method of detecting a PLL status includes the following steps:

Step S610: counting the number of cycles of the PLL clock pll_clk according to a control signal to generate a count value CNT. The control signal has a high level and a low level. At one level, such as the high level, the number of cycles of the PLL clock pll_clk is counted to obtain the count value CNT;

Step S620: analyzing the count value CNT according to the control signal to generate a status code CDE. At the other level of the control signal, the count value CNT obtained in the prior step is analyzed. More specifically, this step calculates an absolute difference between a current count value and a previous count value. The absolute difference is related to a jitter of the PLL clock pll_clk. If the PLL clock pll_clk is relatively stable, the absolute difference will be quite small or even 0. On the contrary, if the PLL clock pll_clk is unstable, the absolute difference may be quite large. That is to say, the absolute difference can be considered an accumulation of the jitter of the PLL clock pll_clk within a period of time. This step may further include dividing the absolute difference by the current count value CNT to obtain a variation value PLL_jitter that indicates a variation degree of the PLL clock pll_clk. The step may further include comparing the variation value PLL_jitter with a predetermined value and generating a status code CDE according to the comparison result; and Step S630: storing the status code CDE in a status storing circuit. The status code CDE generated in the prior step is stored in the status storing circuit. The status storing circuit is made of flip-flops. The number of the flip-flops is related to the number of statuses. The flip-flops are connected in series with the scan chain in the chip so that when the test result is output via the scan chain, the status code CDE is output together with the test result. A condition of the PLL can therefore be determined according to the status code CDE.

In an exemplary embodiment, the method of detecting a PLL status can be applied to both the at-speed test and the function test. In the at-speed test, the control signal is the test control signal test_ctrl provided by the test machine. The test control signal test_ctrl is used to control the switch between the shift mode and the capture mode in the at-speed test. In the function test, however, there is no such signal according to which the method switches between the shift mode and the capture mode depends, so a frequency-divided test clock is used to be the aforementioned control signal. Therefore, the process of the method of detecting a PLL status may further include generating a divided clock by dividing the test clock and selecting the divided clock or the test control signal test_ctrl to be the control signal based on whether the at-speed test or the function test is being carried out.

Moreover, for facilitating the analysis of the PLL status, a minimum value of the count value CNT can be stored in the step S610, and a maximum value of the absolute difference can be stored in the step S620. The minimum value of the count value CNT and the maximum value of the absolute difference can be used as another references for analyzing the PLL.

Since people of ordinary skill in the art can appreciate the implementation detail and the modification thereto of the present method disclosure of FIG. 6 through the disclosure of the device disclosure of FIG. 1, repeated and redundant description is thus omitted. It should be noted that there is no step sequence limitation for the method disclosures as long as the execution of each step is applicable. Furthermore, the shape, size, and ratio of any element and the step sequence of any flow chart in the disclosed figures are just exemplary for understanding, not for limiting the scope of this disclosure. In addition, each aforementioned embodiment may include one or more features. However, this doesn't mean that one carrying out the present disclosure should make use of all the features of an exemplary embodiment at the same time, or should only carry out different embodiments separately. In other words, if an implementation derived from one or more of the embodiments is applicable, a person of ordinary skill in the art can selectively make use of some or all of the features in an exemplary embodiment or selectively make use of the combination of some or all features in several embodiments to have the implementation come true, so as to increase the flexibility of carrying out the present disclosure.

The aforementioned descriptions represent merely the embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A phase lock loop (PLL) status detection circuit for detecting a clock generated by a PLL of a chip to determine a status of the PLL, comprising:
    a counter, configured to generate a count value by counting a number of cycles of the clock according to a control signal to;
    a status analyzing circuit, coupled to the counter, configured to analyze the count value according to the control signal to generate an analyzed result; and
    a status storing circuit, coupled to the status analyzing circuit, configured to store the analyzed result;
    wherein the status storing circuit is coupled to a scan chain of the chip, and the analyzed result is transmitted via the scan chain.

2. The PLL status detection circuit of claim 1, wherein when the control signal is at a first level, the counter is configured to count the number of cycles of the clock; and when the control signal is at a second level, the counter stops counting, and the status analyzing circuit is configured to analyze the count value.

3. The PLL status detection circuit of claim 2, wherein the scan chain has a scan chain length, and a time period of the control signal corresponding to the first level is larger than a product of the scan chain length and a time period of a test clock, in which the test clock is provided outside the chip and configured to transmit a test data to the scan chain.

4. The PLL status detection circuit of claim 3, wherein the PLL status detection circuit has a resolution proportional to the product of the scan chain length and the time period of the test clock.

5. The PLL status detection circuit of claim 1, wherein the status analyzing circuit is configured to generate the analyzed result according to a difference between a current count value and a previous count value.

6. The PLL status detection circuit of claim 5 further comprising:
a register, coupled to the status analyzing circuit for storing a maximum value of an absolute difference between the current count value and the previous count value in the detecting process.

7. The PLL status detection circuit of claim 5, wherein the status analyzing circuit is configured to divide an absolute difference between the current count value and the previous count value by the current count value to obtain a ratio, and the status analyzing circuit is configured to compare the ratio with a predetermined value to generate the analyzed result.

8. The PLL status detection circuit of claim 1 further comprising:
a register, coupled to the counter, for storing a minimum value of the count value generated by the counter in the detecting process.

9. The PLL status detection circuit of claim 1, wherein the analyzed result is an n-bit signal, n being a positive integer, and the status storing circuit further comprises:
n flip-flops connected in series, wherein two flip-flops at the two ends of the n serially connected flip-flops are respectively coupled to one of flip-flops of the scan chain.

10. The PLL status detection circuit of claim 1, wherein the PLL status detection circuit is applied to an at-speed test and a function test of the chip, the chip receives a test control signal in the at-speed test, and the PLL status detection circuit further comprises:
a frequency divider, configured to divide a test clock to generate a divided test clock, wherein the test clock is provided outside the chip, and a test data is transmitted to the scan chain according to the test clock; and
a selection circuit, coupled to the frequency divider and receiving the test control signal, configured to select the test control signal to be the control signal in the at-speed test and to select the divided test clock to be the control signal in the function test.

11. The PLL status detection circuit of claim 1, wherein the control signal is a test control signal received by the chip in an at-speed test, and the test control signal is to control a shift mode and a capture mode in the at-speed test.

12. A method of detecting a phase lock loop (PLL) status, for detecting a clock generated by a PLL of a chip to determine a status of the PLL, comprising:
generating a count value by counting a number of cycles of the clock according to a control signal;
analyzing the count value according to the control signal to generate an analyzed result; and
storing the analyzed result in a status storing circuit;
wherein the status storing circuit is coupled to a scan chain of the chip, and the analyzed result is transmitted via the scan chain.

13. The method of claim 12, wherein when the control signal is at a first level, the step of generating a count value by counting the number of cycles of the clock according to the control signal is performed, and when the control signal is at a second level, the step of analyzing the count value according to the control signal to generate the analyzed result is performed.

14. The method of claim 13, wherein the scan chain has a scan chain length, and a time period of the control signal corresponding to the first level is larger than a product of the scan chain length and a time period of a test clock, in which the test clock is provided outside the chip and configured to transmit a test data to the scan chain.

15. The method of claim 14, wherein the method has a resolution proportional to the product of the scan chain length and the time period of the test clock.

16. The method of claim 12, wherein the step of analyzing the count value according to the control signal to generate the analyzed result generates the analyzed result according to a difference between a current count value and a previous count value.

17. The method of claim 16 further comprising:
storing a maximum value of an absolute difference between the current count value and the previous count value in the detecting process.

18. The method of claim 16, wherein the step of analyzing the count value according to the control signal to generate the analyzed result divides an absolute difference between the current count value and the previous count value by the current count value to obtain a ratio, and compares the ratio with a predetermined value to generate the analyzed result.

19. The method of claim 12 further comprising:
storing a minimum value of the count value generated in the step of counting the number of cycles of the clock in the detecting process.

20. The method of claim 12, wherein the method is applied to an at-speed test and a function test of the chip, the chip receives a test control signal in the at-speed test, and the method further comprises:
dividing a test clock to generate a divided test clock, wherein the test clock is provided outside the chip, and a test data is transmitted to the scan chain according to the test clock; and
selecting the test control signal to be the control signal in the at-speed test and selecting the divided test clock to be the control signal in the function test.

21. The method of claim 12, wherein the control signal is a test control signal received by the chip in an at-speed test, and the test control signal is to control a shift mode and a capture mode in the at-speed test.

* * * * *